United States Patent [19]
Hirata et al.

[11] Patent Number: 5,416,884
[45] Date of Patent: May 16, 1995

[54] SEMICONDUCTOR WAVEGUIDE STRUCTURE OF A II-VI GROUP COMPOUND

[75] Inventors: Shinya Hirata, Tenri; Masahiko Kitagawa, Tottori; Yoshitaka Tomomura, Nara, all of Japan

[73] Assignee: Sharp Kabushiki Kaisha, Japan

[21] Appl. No.: 245,556

[22] Filed: May 18, 1994

[30] Foreign Application Priority Data

May 25, 1993 [JP] Japan .................................. 5-122542

[51] Int. Cl.⁶ .............................................. G02B 6/10
[52] U.S. Cl. ...................................... 385/142; 385/131
[58] Field of Search ................................ 385/129–132, 385/141, 142, 144, 122, 11, 14

[56] References Cited

U.S. PATENT DOCUMENTS

| | | | |
|---|---|---|---|
| 4,701,009 | 10/1987 | Tangonan et al. | 385/14 |
| 5,013,129 | 5/1991 | Harada et al. | 385/122 X |
| 5,245,465 | 9/1993 | Tomita et al. | 385/11 X |

FOREIGN PATENT DOCUMENTS 4-266075  9/1992  Japan .

OTHER PUBLICATIONS

Ichino et al. "Design and Fabrication of II-VI Semiconductor Heterostructures", Japanese Journal of Applied Physics, vol. 61, No. 2, pp. 117–125, Feb. 1992.

*Primary Examiner*—John D. Lee
*Attorney, Agent, or Firm*—Nixon & Vanderhye

[57] ABSTRACT

A semiconductor waveguide structure of the II-VI group compound semiconductor made of the II group element and the VI group element. The waveguide structure includes a waveguide layer and clad layers which puts the waveguide layer therebetween. The waveguide layer has a refractive index larger than a refractive index of each clad layer. At least one of the clad layers contains the element Cd. With such an arrangement, the refractive index of one clad layer is established to be different from that of the other clad layer. In such a case, it is preferable that the semiconductor waveguide structure comprises at least two waveguide layers which are adjacent to each other and that the structure has either one of the features as follows: each refractive index of the waveguide layers varies stepwise at each boundary surface of the layers; the refractive index of at least one of the waveguide layers varies so as to be inclined; and super lattice layers are formed between the clad layer and the waveguide layers. Further, in the arrangement, more than two waveguide layers and clad layers may be formed in such a manner that each of the waveguide layer is put between the clad layers.

18 Claims, 3 Drawing Sheets

SEMICONDUCTOR WAVEGUIDE STRUCTURE OF A II-VI GROUP COMPOUND

BACKGROUND OF THE INVENTION (1) Field of the Invention

This invention relates to a waveguide structure for a semiconductor, and more particularly, to a waveguide structure made of the II-VI group compound comprising a II group element (e.g., Zn, Cd, Mg, Hg, etc.) and a VI group element (e.g., O, S, Se, Te, etc.).

(2) Description of the Prior Art

In the prior art, a wide variety of structures has been suggested and produced for waveguides of the III-V group compound semiconductor.

However, in such III-V group compound semiconductor, heretofore it has been impossible to guide a blue/green beam to violet beam of wave lengths shorter than approximately 0.54 micrometers.

Also in the prior art, a waveguide structure as shown in FIG. 1 has been suggested for the II-VI group compound semiconductors. In FIG. 1, reference numerals 101 and 105 designate clad layers having a composition of $ZnS_{0.07}Se_{0.93}$, 102 and 104 waveguide layers of ZnSe, and 103 a waveguide layer of $Zn_{0.8}Cd_{0.2}Se$. Each of the clad layers 101 and 105 has an approximately 2 μm in thickness and the thickness of the waveguide layer 103 is 0.1 μm. Note that, both GaAs buffer layer 106 and ZnSe buffer layer 107 are formed between a GaAs substrate 201 and the clad layer 101 (M. A. Haase et al, Appl. Phys. Lett., 59 (1991) 1272).

Besides the above construction of the II-VI group compound semiconductors, there is known a waveguide which employs a multi-quantum well of $Zn_{0.08}Cd_{0.12}Se$-$ZnS_{0.07}Se_{0.93}$ as the waveguide layer while using the clad layer of $ZnS_{0.07}Se_{0.93}$ (H. Jeon et al, Appl. Phys. Lett., 59 (1991) 3619) and another waveguide which employs a multi-quantum well of $Zn_{0.91}Cd_{0.09}Se$-$Zn_{0.95}Cd_{0.05}S_{0.07}Se_{0.93}$ (K. Ichino et al, Oyo Buturi (Japanese Journal of Applied Physics), 61 (February 1992) 117).

In the II-VI group compound semiconductor containing the elements Zn, Cd, S and Se, it is impossible to form a waveguide having a large difference in refractive index between the clad layer and the waveguide layer any yet have it satisfy a lattice alignment condition. Therefore, there is known a conventional waveguide structure which contains a lattice inalignment structure (a difference of lattice constant) between the clad layer and the waveguide layer. For example, in the above-mentioned conventional structure of FIG. 1, there is contained one lattice inalignment of 0.24% between the layers of $ZnS_{0.07}Se_{0.93}$ and the layers of ZnSe and the other lattice inalignment of about 1.5% between the ZnSe layers and the layer of $Zn_{0.8}Cd_{0.2}Se$. The refractive indexes of the layers of $ZnS_{0.07}Se_{0.93}$, ZnSe and $Zn_{0.8}Cd_{0.2}Se$ exhibit 2.67, 2.69 and 2.83, respectively, to the beam having a wavelength of 530 nm. Therefore, the difference in refractive index between the clad layer and the waveguide layer is small, and particularly small between the layers of $ZnS_{0.07}Se_{0.93}$ and the layers of ZnSe. Consequently, in the II-VI group compound semiconductor laser, the function to confine the beam therein is remarkably small.

As mentioned above, in the conventional waveguide structure of the II-VI group compound semiconductor, if the difference in refractive index is increased between the clad layer and the waveguide layer to effect the beam confining function, there would be produced a large lattice inalignment therebetween, whereby it would be difficult to form a crystal thin film of fine quality.

SUMMARY OF THE INVENTION

It is an object of the present invention to provide a semiconductor waveguide structure capable of effecting the beam confining function thereof by the crystal thin film of fine quality and capable of increasing a difference of refractive index between a clad layer and a waveguide layer contained therein, while reducing a difference in the lattice constant between the waveguide layer and the clad layer.

The objects of the invention described above can be accomplished by a semiconductor waveguide structure of the II-VI group compound, comprising:

a waveguide layer formed by the II-VI group compound semiconductor made of a II group element and a VI group element; and clad layers formed by the II-VI group compound semiconductor made of the II group element and the VI group element, the clad layers being arranged in such a manner that the waveguide layer is put therebetween the waveguide layer having a refractive index larger than either of refractive indexes of the clad layers; one of the refractive indexes being different from the other of the refractive indexes; at least one of the clad layers containing the element Cd.

In the above arrangement, preferably, the semiconductor waveguide further comprises at least two waveguide layers which are adjacent to each other and each refractive index of the waveguide layers varies stepwise at each of boundary surfaces thereof. Alternatively, it is preferable that the semiconductor waveguide structure further comprises at least two waveguide layers which are adjacent to each other and that the refractive index of at least one of the waveguide layers, which is adjacent to the clad layer, varies so as to be inclined.

Further, it is preferable that super lattice layers are formed between the clad layer and the waveguide layers.

According to the present invention, there is also provided a semiconductor waveguide structure comprising:

at least two waveguide layers formed by the II-VI group compound semiconductor made of a II group element and a VI group element; and clad layers formed by the II-VI group compound semiconductor made of the II group element and the VI group element, the clad layers being arranged in such a manner that each of the waveguide layer is put therebetween;

each of the waveguide layers having a refractive index larger than either of refractive indexes of the clad layers; at least one of the clad layers containing the element Cd.

The reason why the element Cd is used as a constituent of the clad layer is as follows. That is, among the II-VI group compound semiconductors, a compound $Zn_YCd_{1-Y}S_XSe_{1-X}$ ($0 \leq y \leq 1$, $0 \leq x \leq 1$) containing the element Cd is a mixed-crystalline compound which has a lattice constant of 5.41 to 6.05 Å, where the refractive index of the compound is smaller than that of a compound $ZnS_XSe_{1-X}$ if the former has the same lattice constant as the latter. Therefore, by using the compound $Zn_YCd_{1-Y}S_XSe_{1-X}$ as the clad layer, it is possible to reduce a difference of the lattice constant between the waveguide layer and the clad layer and to increase the difference of refractive index therebetween, whereby the beam confining function can be enhanced.

Additionally, according to the present invention, since two kinds of compounds $Zn_YCd_{1-Y}S_XSe_{1-X}$ are respectively used for the two clad layers putting the waveguide layer therebetween, a distribution of an electric field in the waveguide is deviated on a side of the clad layer of higher refractive index, so that the distribution will be in asymmetric arrangement. In this case, a density of beam confined in the layer of the highest refractive index becomes to be small in comparison with a beam density in a case that the distribution is in symmetric arrangement. Consequently, it is possible to restrain a deterioration of the waveguide layer by the beam.

On the other hand, in the present invention, since more than 2 waveguide layers are embedded in the clad layer constituted by the compound $Zn_YCd_{1-Y}S_XSe_{1-X}$ containing the element Cd and accordingly the beam density is reduced in each waveguide layer, the deterioration of the waveguide layer by the beam can be restrained consequently. Furthermore, since the waveguide layers are arranged in an asymmetric manner, the deterioration of the waveguide layer by the beam can be restrained similarly.

DESCRIPTION OF THE PREFERRED EMBODIMENTS

Various embodiments of the present invention are now described with reference to the drawings.

Figure 1:
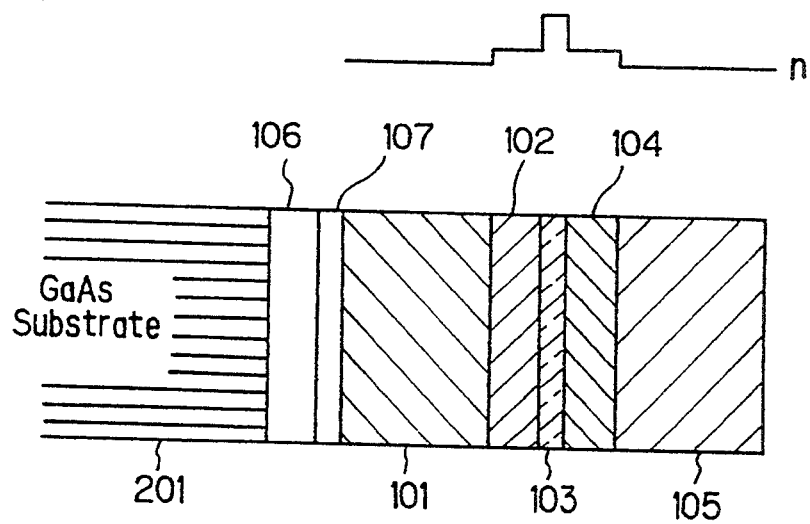
FIG. 1 is a sectional view showing a conventional waveguide structure, in which refractive index is also illustrated.
Figure 2:
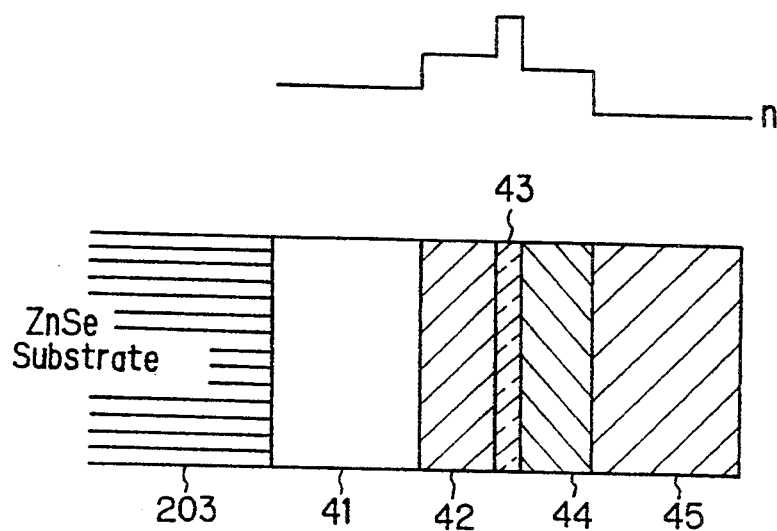
FIG. 2 is a sectional view showing a waveguide structure according to a first embodiment of the present invention, including refractive index.

FIG. 2 shows a sectional view of a waveguide structure according to a first embodiment of the present invention and a refractive index of the waveguide.

In this embodiment, by a hetero-epitaxy method, thin films of a clad layer 41, waveguide layers 42–44 and another clad layer 45 are formed on a ZnSe substrate 203 in that order. Note that, as a practical example of the hetero-epitaxy method, a molecular beam epitaxial (MBE) system will be described later, with reference to a conceptional view of FIG. 6.

Regarding the composition of the respective layer, the clad layers 41 is composed of the compound $Zn_{0.8}Cd_{0.2}S_{0.3}Se_{0.7}$ and the clad layer 45 is composed of the compound $Zn_{0.4}Cd_{0.6}S_{0.6}Se_{0.4}$. Additionally, the waveguide layer 42 is composed of the compound $Zn_{0.7}Cd_{0.3}S_{0.3}Se_{0.7}$; the waveguide layer 43 is composed of the compound $Zn_{0.6}Cd_{0.4}S_{0.3}Se_{0.7}$; and the waveguide layer 44 is composed of the compound $Zn_{0.4}Cd_{0.6}S_{0.45}Se_{0.55}$.

As shown in the refractive index diagram of FIG. 2, in the embodiment of FIG. 2, the refractive index of the clad layer 41 is different from that of the other clad layer 45. Further, the refractive index changes stepwise at each of boundary faces of the waveguide layers 42, 43 and 44. Therefore, since the beam confined in the waveguide layer is inclined toward the clad layer 41 of $Zn_{0.8}Cd_{0.2}S_{0.3}Se_{0.7}$, a density of the beam can be reduced in the waveguide layer 43 ($Zn_{0.6}Cd_{0.4}S_{0.3}Se_{0.7}$) of high refractive index, whereby the deterioration of the films can be restrained. In this case, it should be noted that the refractive indexes (n) of the above layers against the beam having a wave length of 530 nm are as follows;

clad layer 41: 2.67
waveguide layer 42: 2.74
waveguide layer 43: 2.86
waveguide layer 44: 2.72
clad layer 45: 2.63

Preferably, the waveguide layer 43, the refractive index of which is the highest in these layers, has a film thickness of about 5 to 200 Å since there exists the lattice inalignment of about 1% against the clad layers 41 and 45. Note, the lattice constant of the clad layer 41 is close to that of the layer 45. Regarding the composition of the clad and waveguide layers, it produces very little effect on the structures of the layers to whatever compositions the clad layers are changed, so long as each refractive index of the clad layers is smaller than that of the waveguide layer.

Figure 3:
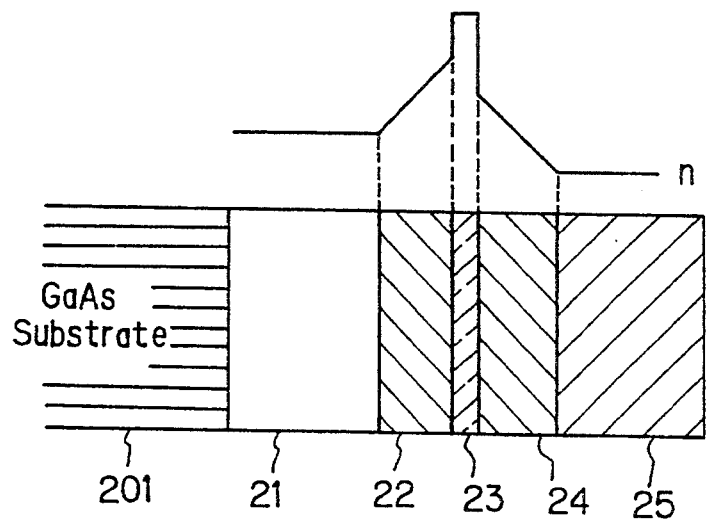
FIG. 3 is a sectional view showing a waveguide structure according to a second embodiment of the present invention, including the refractive index diagram.

FIG. 3 shows a sectional view of a waveguide structure according to a second embodiment of the present invention, including a refractive index of the waveguide.

According to the embodiment of FIG. 3, thin films of a clad layer 21, waveguide layers 22–24 and another clad layer 25 are respectively formed on a ZnSe substrate 201 in order, by the hetero-epitaxy method. Regarding the composition of the respective layers, the clad layer 21 is composed of the compound $Zn_{0.7}Cd_{0.3}S_{0.5}Se_{0.5}$ and another clad layer 25 is composed of the compound $Zn_{0.6}Cd_{0.4}S_{0.7}Se_{0.3}$. The waveguide layer 23 is formed by a thin film of high refractive index, which is composed of the compound $Zn_{0.6}Cd_{0.4}S_{0.3}Se_{0.7}$. The waveguide layers 22 and 24 are respectively formed by the thin films whose compositions are controlled as follows. That is, in each of the compositions, both of factors "Y" and "X" are controlled in $Zn_YCD_{1-Y}S_XSe_{1-X}$ in such a manner that their refractive indexes are gradually increased from surfaces in contact with the clad layers 21 and 25 to the other surfaces in contact with the waveguide layer 23 of high refractive index. In this case, the refractive indexes (n) of the above layers against the beam having a wave length of 530 nm are as follows;

clad layer 21: 2.67
waveguide layer 23: 2.86
clad layer 25: 2.57

It is preferable that, in the layers, the waveguide layer 23 of the highest refractive index of the three have a film thickness of about 5 to 150 Å since there exists a lattice inalignment of about 1.5% against the clad layers 21 and 25.

As shown in FIG. 3, in the relationship of the refractive indexes, it will be understood that the refractive index of the clad layer 21 is not in contrast with that of the clad layer 25. Consequently, since the beam confined in the waveguide layer is inclined toward the clad layer 21, i.e., the layer of $Zn_{0.7}Cd_{0.3}S_{0.5}Se_{0.5}$, the density of the beam can be reduced in the waveguide layer 23 ($Zn_{0.6}Cd_{0.4}S_{0.3}Se_{0.7}$) of high refractive index, whereby the deterioration of the films can be restrained.

Figure 4:
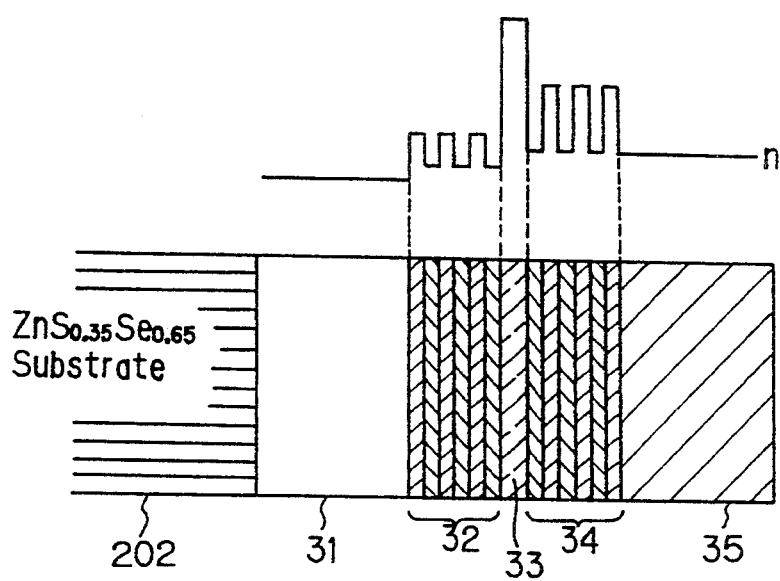
FIG. 4 is a sectional view showing a waveguide structure according to a third embodiment of the present invention, including a refractive index diagram.

FIG. 4 shows a sectional view of a waveguide structure according to a further (third) embodiment of the present invention, including a diagram of the refractive index of the waveguide.

According to the embodiment of FIG. 4, thin films of a clad layer 31, a super lattice layer 32, a waveguide layer 33, another super lattice layer 34 and a clad layer 35 are respectively formed on a $ZnS_{0.35}Se_{0.65}$ substrate 202 in that order, by the hetero-epitaxy method. Regarding the composition of the respective layer, the clad layer 31 is composed of the compound $Zn_{0.6}Cd_{0.4}S$ and another clad layer 35 is composed of the compound $ZnS_{0.35}Se_{0.65}$. The super lattice layer 32 is composed of the compound $Zn_{0.6}Cd_{0.4}S$-$Zn_{0.6}Cd_{0.4}S_{0.45}Se_{0.55}$ and the other super lattice layer 34 is composed of the compound $ZnS_{0.35}Se_{0.65}$-$Zn_{0.6}Cd_{0.4}S_{0.35}Se_{0.65}$. Further, the waveguide layer 33 is composed of the compound $Zn_{0.5}Cd_{0.5}S_{0.4}Se_{0.6}$.

Both super lattice layers 32 and 34 are arranged to alleviate a lattice strain between the waveguide layer and the clad layer. The super lattice layer 32 is constituted by a thin film formed by laminating $Zn_{0.6}Cd_{0.4}S$ and $Zn_{0.6}Cd_{0.4}S_{0.45}Se_{0.55}$ by turns. The super lattice layer 34 is constituted by a thin film formed by laminating $ZnS_{0.35}Se_{0.65}$ and $Zn_{0.6}Cd_{0.4}S_{0.35}Se_{0.65}$ by turns.

In this case, as shown in FIG. 4, the refractive index of the clad layer 31 is different from that of the clad layer 35. Additionally, both the super lattice layers 32 and 34 are constituted by films of high refractive index and films of low refractive index, respectively. Each film of high refractive index in the super lattice layers 32 and 34 is established so as to have the refractive index lower than that of the waveguide layer 33. Therefore, even though a refractive index average in the super lattice layer 32 is more than the refractive index of the clad layer 31 and a refractive index average in the super lattice layer 34 is more than the refractive index of the clad layer 35, still either of these refractive index averages is lower than the high refractive index of the waveguide layer 33. These refractive indexes (n) of the above layers against the beam having a wave length of 530 nm are as follows;

clad layer 31: 2.44
super lattice layer 32: 2.44–2.72
waveguide layer 33: 2.96
super lattice layer 34: 2.57–2.81
clad layer 35: 2.57

In the case of the FIG. 4 embodiment, it is preferable that the waveguide layer 33 having the highest refractive index comprise a film of about 5 to 1000 Å in thickness, which may be somewhat thicker as compared to aforementioned other waveguide layers since the configuration includes a pair of super lattice layers 32 and 34, although there exists the lattice inalignment of about 1% against the clad layers 31 and 35. In addition, it is preferable that each film constituting the super lattice layers 32 and 34 comprise a film of about 2 to 50 Å in thickness and that about 2 to 100 layers in total are contained in each layer.

With the above-mentioned configuration, not only the beam confining function of the semiconductor waveguide is enhanced, but the beam confined in the waveguide layer is inclined toward the clad layer and thus the density of the beam can be reduced in the waveguide layer, whereby the deterioration of the films can be restrained. Furthermore, since each super lattice layer is arranged between the clad layer and the waveguide layer, it is possible to alleviate a lattice strain therebetween.

Figure 5:
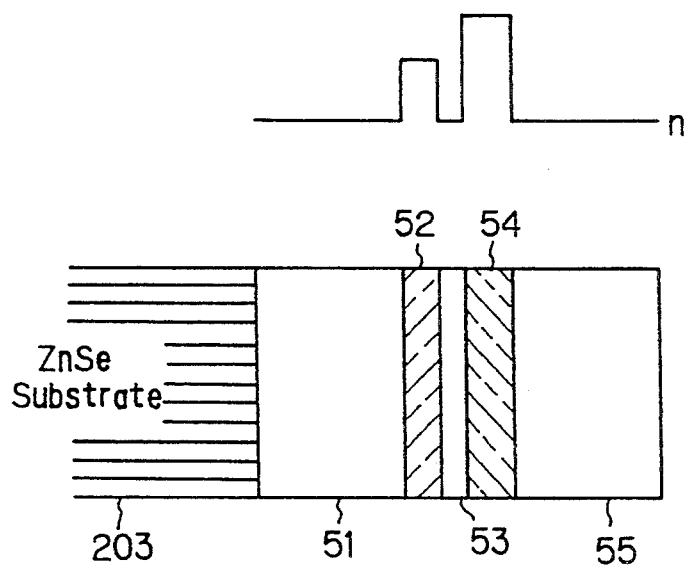
FIG. 5 is a sectional view showing a waveguide structure according to a fourth embodiment of present invention, including the refractive index.

FIG. 5 shows a sectional view of a waveguide structure according to a further other (fourth) embodiment of the present invention, including a diagram of the refractive index of the waveguide.

According to the embodiment of FIG. 5, thin films of a clad layer 51, a waveguide layer 52, a clad layer 53, a waveguide layer 54 and a clad layer 55 are respectively formed on a ZnSe substrate 203 in order, by the hetero-epitaxy method. Regarding the composition of the respective layers, the clad layers 51, 53 and 55 are respectively composed of the compound $Zn_{0.8}Cd_{0.2}S_{0.3}Se_{0.7}$; the waveguide layer 52 is composed of the compound $Zn_{0.8}Cd_{0.2}Se$ and the waveguide layer 54 is composed of the compound $Zn_{0.7}Cd_{0.3}Se$.

In FIG. 5, since the waveguide layers 52 and 54, the respective refractive indexes of which are different from each other, are embedded between the clad layers 51, 53 and 55 of a similar refractive index level, the refractive index diagram shown in the figure exhibits a asymmetric waveguide structure. These refractive indexes (n) of the layers against the beam having a wave length of 530 nm are 2.67 for the clad layers 51, 53, 55; 2.83 for the waveguide layer 52; and 3.04 for the waveguide layer 54, respectively.

It is preferable that, in these layers, the waveguide layer 52 of the second highest refractive index has a film thickness of about 5 to 200 Å since there exists the lattice inalignment of about 1.5% against the clad layers 51, 53 and 55. In this case, preferably, the clad layer 53 is so thin that the film thickness is within about 20 to 1000 Å.

With such a configuration, similarly to the previous embodiment of FIG. 4, the density of beam can be reduced in the waveguide layer 54 since the waveguide structure becomes to be asymmetric, whereby the deterioration of the films can be restrained.

Finally, a molecular beam epitaxial (MBE) system, which is adopted in the above-mentioned embodiments and which is a practical example of means for forming thin film by the hetero-epitaxy method, will be described below. Note that, as the hetero-epitaxy method, there are known a variety of methods such as MBE (molecular beam epitaxial) method, MOCVD (metal organic chemical vapor deposition) method, MOMBE (gas sauce MBE or chemical beam epitaxy) method and so on. Although some in these methods have been in practical use, we hereto describe processing conditions etc. of the system adopting the MBE method as an example of the above methods.

Figure 6:
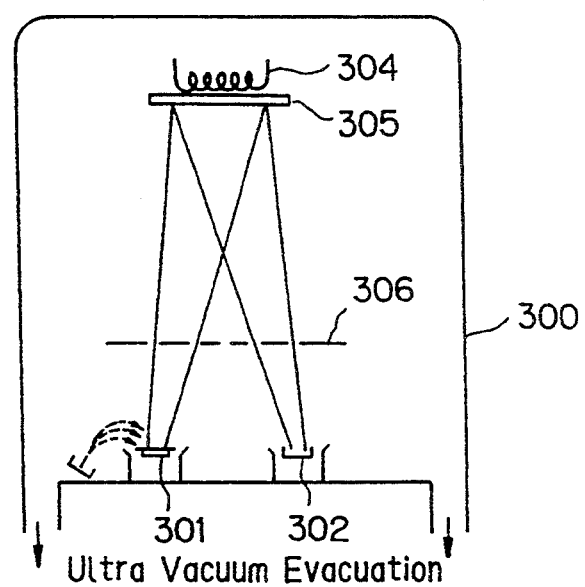
FIG. 6 is a conceptional view of a molecular beam epitaxial (MBE) system.

FIG. 6 is a conceptional view of the molecular beam epitaxial (MBE) system. In operation, crucibles 301 and 302 in which elements constituting crystals are contained are heated in a growth chamber 300 evacuated to an ultra high vacuum, whereby emitting the elements in vapor from the crucibles 301 and 302 in the form of molecular beams. Then, by striking the beams against a clean crystal substrate 305 heated by a heater 304, a thin film of single crystal can be grown epitaxially. Note, in this operation, the striking control of the elements is carried out by opening/closing of a shutter 306.

The processing conditions of the MBE system used in the previous embodiment are as follows;

back pressure of system: $1 \times 10^{-10}$ Torr pressure of each element at the time of forming thin film
Zn: $1 \times 10^{-7} - 7 \times 10^{-7}$ Torr
Cd: $1 \times 10^{-7} - 2 \times 10^{-6}$ Torr
S: $5 \times 10^{-7} - 2 \times 10^{-6}$ Torr
Se: $1 \times 10^{-7} - 2 \times 10^{-6}$ Torr Note that, in such MBE system, although any one of the elements Cl, Ga, In and Al etc. can be used as a donor for forming N-type semiconductor and any one of the elements N, P, As, Li and Na etc. can be used as an acceptor for forming P-type semiconductor, there may be a case that such impurities are not charged.

As mentioned above, according to the present invention, it is possible to reduce the difference in lattice constant between the waveguide layer and the clad layer in the II–VI group compound semiconductor waveguide structure while increasing the difference of refractive index therebetween, whereby the beam confining function of the semiconductor waveguide can be enhanced. Furthermore, it is possible to restrain the deterioration of film having a high refractive index.

What is claimed is:

1. A semiconductor waveguide structure of a II–VI group compound, comprising:
   a waveguide layer formed by a II–VI group compound semiconductor made of a II group element and a VI group element; and
   first and second clad layers formed by the II–VI group compound semiconductor made of the II group element and the VI group element, said first and second clad layers being arranged in such a manner that said waveguide layer is put therebetween, said waveguide layer having a refractive index larger than a refractive index of said first clad layer and a refractive index of said second clad layer; the refractive index of said first clad layer being different from the refractive index of said second clad layer; at least one of said clad layers containing the element Cd.

2. A semiconductor waveguide structure as claimed in claim 1, wherein said refractive index of said waveguide layer varies.

3. A semiconductor waveguide structure as claimed in claim 2, wherein said waveguide layer is a first waveguide layer and further comprising at least a second waveguide layer and a third waveguide layer, the first waveguide layer having a boundary surface with the second waveguide layer and the second waveguide layer having a boundary surface with the third waveguide layer, wherein refractive indexes of said first, second, and third waveguide layers vary stepwise at each of said boundary surfaces.

4. A semiconductor waveguide structure as claimed in claim 3, wherein the refractive index of said first waveguide layer is greater than the refractive index of said third waveguide layer, and wherein the refractive index of said second waveguide layer is greater than the refractive index of said first waveguide layer and the refractive index of said third waveguide layer.

5. A semiconductor waveguide structure as claimed in claim 2, wherein said refractive index of said waveguide layer varies so as to be inclined.

6. A semiconductor waveguide structure as claimed in claim 5, further comprising at least two waveguide layers which are adjacent to each other, wherein said refractive index of at least one of said waveguide layers, which is adjacent to one of said clad layers, varies so as to be inclined.

7. A semiconductor waveguide structure as claimed in claim 1, wherein superlattice layers are formed between said clad layers and said waveguide layer.

8. A semiconductor waveguide structure as claimed in claim 7, wherein said superlattice layers are formed by alternating thin films of differing compositions.

9. A semiconductor waveguide structure as claimed in claim 8, wherein one of said superlattice layers is formed by alternating a film of $Zn_{0.6}Cd_{0.4}S$ and a film of $Zn_{0.6}Cd_{0.45}Se_{0.55}$.

10. A semiconductor waveguide structure as claimed in claim 8, wherein one of said superlattice layers is formed by alternating a film of $ZnS_{0.35}Se_{0.65}$ and a film of $Zn_{0.6}Cd_{0.4}S_{0.35}Se_{0.65}$.

11. A semiconductor waveguide structure of a II–VI group compound, comprising:
    at least two waveguide layers formed by a II–VI group compound semiconductor made of a II group element and a VI group element; and
    clad layers formed by the II–VI group compound semiconductor made of the II group element and the VI group element, said clad layers being arranged in such a manner that said waveguide layers are put therebetween;
    each of said waveguide layers having a refractive index larger than any of the refractive indexes of said clad layers; at least one of said clad layers containing the element Cd.

12. A semiconductor waveguide structure as claimed in claim 11, wherein the refractive index of at least one of said waveguide layers varies.

13. A semiconductor waveguide structure as claimed in claim 12, further comprising a further waveguide layer, the further waveguide layer having boundary surfaces with the at least two waveguide layers, wherein refractive indexes of said waveguide layers vary stepwise at each of said boundary surfaces.

14. A semiconductor waveguide structure as claimed in claim 12, wherein said refractive index of at least one of said waveguide layers varies so as to be inclined.

15. A semiconductor waveguide structure as claimed in claim 11, wherein at least one of said waveguide layers is a superlattice layer.

16. A semiconductor waveguide structure as claimed in claim 15, wherein said superlattice layer is formed by alternating thin films of differing compositions.

17. A semiconductor waveguide structure as claimed in claim 15, wherein said superlattice layer is formed by alternating a film of $Zn_{0.6}Cd_{0.4}S$ and a film of $Zn_{0.6}Cd_{0.45}S_{0.55}Se_{0.65}$.

18. A semiconductor waveguide structure as claimed in claim 15, wherein said superlattice layer is formed by alternating a film of $ZnS_{0.35}Se_{0.65}$ and a film of $Zn_{0.6}Cd_{0.4}S_{0.35}Se_{0.65}$.

* * * * *